(12) United States Patent
Yoshida et al.

(10) Patent No.: US 6,580,143 B2
(45) Date of Patent: Jun. 17, 2003

(54) THIN-FILM CIRCUIT SUBSTRATE AND METHOD OF PRODUCING SAME

(75) Inventors: Koji Yoshida, Kusatsu (JP); Makoto Tose, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/973,530

(22) Filed: Oct. 9, 2001

(65) Prior Publication Data

US 2002/0090831 A1 Jul. 11, 2002

(30) Foreign Application Priority Data

Oct. 10, 2000 (JP) ........................................ 2000-308949

(51) Int. Cl.[7] .............................................. H01L 29/00
(52) U.S. Cl. ........................ 257/508; 438/623; 438/781; 438/778; 438/780; 430/256; 430/262; 430/263; 430/264; 430/291; 430/300; 427/581; 427/553; 427/554; 257/672; 257/25; 257/777
(58) Field of Search ................................ 438/535, 623, 438/780, 781, 778; 430/256, 262, 263, 264, 291, 300; 427/581, 553, 554; 257/672, 508, 25, 777

(56) References Cited

U.S. PATENT DOCUMENTS 4,563,316 A * 1/1986 Isaka et al. ................. 264/448
5,069,926 A * 12/1991 Iwata et al. ................. 427/491
5,599,648 A * 2/1997 Kondo et al. ............... 430/256
5,736,251 A * 4/1998 Pinchuk ...................... 428/447
6,117,497 A * 9/2000 Murahara et al. ........... 427/581
6,299,983 B1 * 10/2001 Van Alsten ................. 428/470
6,340,822 B1 * 1/2002 Brown et al. ................ 257/25
6,348,738 B1 * 2/2002 Dery et al. .................. 257/778

FOREIGN PATENT DOCUMENTS

| JP | 362205116 A | * | 9/1987 | ................ 528/28 |
| JP | 8134639 | | 5/1996 | |
| JP | 9219586 | | 8/1997 | |

* cited by examiner

Primary Examiner—Matthew Smith
Assistant Examiner—V. Yevsikov
(74) Attorney, Agent, or Firm—Keating & Bennett, LLP

(57) ABSTRACT

A surface modification layer having a surface modification coefficient of 0.1 to 0.5 is formed on the surface of an organic insulating film on a substrate. A metal wiring is provided on the surface of the organic insulating film having the surface modification layer formed at the surface thereof. Thus, the bonding strength between the metal wiring and the organic insulating film is enhanced. The surface modification coefficient is defined by the formula:

$$SMC = \frac{\text{the total number of functional groups}}{\text{the total number of C atoms present at the surface of the organic insulating film}} \quad (1)$$

8 Claims, 5 Drawing Sheets

THIN-FILM CIRCUIT SUBSTRATE AND METHOD OF PRODUCING SAME

BACKGROUND OF THE INVENTION

1. Field of the Invention

The present invention relates to a thin-film circuit substrate in which an organic insulating film formed on the surface of the substrate and a metallic wiring (electrode material) formed on the insulating film have high adhesion to each other, a method of producing the same, and a high frequency module using the thin-film circuit substrate.

2. Description of the Related Art

In the recent radio communication field, high frequency devices are required to have small sizes, low costs, and high performances.

Moreover, the high frequency devices need to be provided with transmission lines having a low transmission loss and a high efficiency. Wiring in the devices is carried out by using an electrode material (metallic material) having a low resistance. Moreover, an inter-layer insulating film between wires needs to be formed with a dielectric material having a low relative dielectric constant and a low dielectric loss tangent.

Thus, to satisfy the above-described requirements, various types of circuit substrates have been developed in which low resistance materials such as Au, Cu, Ag, Al, and so forth are used as the electrode material, and organic resins having a low dielectric constant and a low dielectric loss tangent, such as polyimide, epoxy resins, benzocyclobutene resins, bismaleimide triazine resins, and so forth are used as the dielectric material.

However, in thin-film circuit substrates containing a combination of organic resins and an electrode material, bonding strengths between the organic resins and the electrode material are insufficient. This causes a problem in that film-peeling occurs during processes of forming a metal wiring, bonding wires, and so forth. Thus, to increase the bonding strength between an organic resins and an electrode material, for example, the following various methods have been proposed, in which (1) an adhesion layer made of a metal having a relatively high bonding strength to an organic resin is formed as an adhesion layer between an electrode material and the organic resin, (2) the surface of an organic resin is oxygen-plasma treated to enhance the bonding strength thereof (Japanese Unexamined Patent Application Publication No. 8-134639).

(3) a polar polymer is formed on an organic resin to improve the adhesion between the organic resin and the polar polymer (Japanese Unexamined Patent Application Publication No. 9-219586), and (4) the surface of an organic insulating film is cleaned, activated, and surface-roughened by plasma treatment.

Referring to the above-described method (1) in which the metal film having a high adhesion strength to the organic resin is formed as the adhesion layer between the organic resin and the electrode material, different types of metals such as Cr, Ti, Ni, Nb, V, and so forth are used for the adhesion layer. Film-peeling during a wiring process can be prevented, due to the operation and effects of the adhesion layer made of such a metal as mentioned above. However, the method (1) is ineffective in preventing film-peeling during a wire-bonding process in which supersonic waves and high temperature loads are applied. In fact, this method (1) is not a satisfactory countermeasure against film-peeling.

Referring to the method (2) in which the surface of the organic resin is surface-treated by oxygen-plasma, the adhesion strength between the electrode material and the organic resin can be enhanced. However, the surface of the organic insulating film is oxidized. This causes a problem in that the electrical characteristics such as the relative dielectric constant and the dielectric loss tangent are degraded so that target characteristics for the high frequency module can not be obtained.

Referring to the above-described method (3) in which the polar polymer is formed on the organic resin to enhance adhesion between the organic resin and the metal, a process of polymerizing polar monomers after the surface of the organic resin is activated is required. Although the adhesion between the metal and the organic resin is enhanced, the time required for the processing is long. Thus, a problem arises in that the manufacturing cost of the high frequency module increases.

Referring to the method (4) in which the surface of the organic insulating film is cleaned, activated, and surface-roughened by plasma treatment to enhance the adhesive properties of the organic insulating film, the treatment is carried out in the atmosphere, which causes the surface of the organic insulating film to be oxidized. Thus, a problem arises in that the electrical characteristics of the organic resin such as the relative dielectric constant, the dielectric loss tangent, and so forth are deteriorated. Moreover, the surface-roughness at the surface of the organic insulating film is large, and the rough surface-features are transferred to the wiring formed on the organic insulating film. Thus, problematically, the resistance is increased, so that target characteristics for the high frequency module can not be obtained in millimeter wave or microwave regions.

Accordingly, it is an object of the present invention to provide a thin-film circuit substrate in which an organic insulating film on the surface of a substrate and a metal wiring (electrode material) formed thereon have high adhesive properties for strongly adhering to each other, a method of producing the same, and a high frequency module using the thin-film circuit substrate.

SUMMARY OF THE INVENTION

To achieve the above-described object, according to the present invention, there is provided a thin-film circuit substrate which comprises a substrate, an organic insulating film formed on the surface of the substrate, and a metal wiring made of a thin-film metal formed on the organic insulating film, wherein the surface of the organic insulating film is provided with a surface modification layer having a surface modification coefficient (SMC) defined by the following formula:

$$SMC = \frac{\text{the total number of functional groups}}{\text{the total number of C atoms present at the surface of the organic insulating film}} \qquad (1)$$

wherein the surface modification coefficient is between 0.1 and 0.5.

In the thin-film circuit substrate in accordance with the present invention, the surface modification layer having a surface modification coefficient of 0.1 to 0.5 is provided at the surface of the organic insulating film formed on the substrate, and the metal wiring is formed on the surface of the organic insulating film having the surface modification layer. Accordingly, the bonding strength between the metal wiring (electrode material) and the organic insulating film can be enhanced without deteriorating the electrical characteristics such as the relative dielectric constant and the dielectric loss tangent.

In the present invention, the term "surface modification coefficient" is defined as the ratio of the number of C atoms constituting functional groups to the number of C atoms present at the surface of the organic insulating film. The surface modification coefficient (SMC) is expressed by the following formula:

$$SMC = \frac{\text{the total number of functional groups}}{\text{the total number of C atoms present at the surface of the organic insulating film}} \quad (1)$$

Hereinafter, a method of determining the surface modification coefficient, employed in the present invention, will be described in more detail with reference to FIG. 5.

To determine the surface modification coefficient, the ratios of C atoms contained in the respective bonds at the surface of an organic insulating film are identified by X-ray photoelectron spectroscopy.

For example, FIG. 5 shows the C1s spectra of the surface of the organic insulating film (benzocyclobutene resin) obtained by the X-ray photoelectron spectroscopy. The ratios of the areas of the spectra in FIG. 5 represent the ratios of the number of C atoms contained in the respective bonds. Moreover, the sum of the areas of the spectra represents the total number of C atoms present in the detected area. In particular, the percentage of C atoms contained in the C—H or C—C bonds, the —C=O bonds, and the —COO bonds detected as shown in FIG. 5 are 84%, 10%, and 6%, respectively. The percentage of C atoms constituting the functional groups at the surface of the organic insulating film is 16%, which is the sum of 10% for the —C=O bonds and 6% for the —COO bonds. In this case, the surface modification coefficient, calculated by the formula (1) is 0.16 ($^{16}/_{100}$=0.16).

In the present invention, the term "metal wiring" includes an electrode, a pad, and so forth, in addition to a transmission line.

The shape and size of the substrate and materials constituting the substrate have no special limitations. Substrates made of different materials and formed in different shapes and sizes may be employed.

The metal wiring may have a single-layered structure, or may have a multi-layered structure, namely, an at least two layer structure which includes a metallic material layer as an adhesion layer and a layer formed on the adhesion layer, made of a metallic material different from that for the adhesion layer.

According to the present invention, the surface modification coefficient is in the range of 0.1 to 0.5. If the surface modification coefficient is less than 0.1, the bonding strength between the metal wiring and the organic insulating film will be insufficient. Moreover, if the surface modification coefficient is more than 0.5, the electrical characteristics of the organic insulating film may be deteriorated.

Preferably, at least one functional group selected from the group consisting of a sulfonic group, a carboxyl group, a carbonyl group, and a phenol group is present at the surface of the surface-modification layer.

By providing the thin-film circuit substrate with the organic insulating film in which at least one functional group selected from the group consisting of a sulfonic group, a carboxyl group, a carbonyl group, and a phenol group is present at the surface of the surface-modification layer, the bonding strength between the metal wiring (electrode material) and the organic insulating film can be enhanced with the electrical characteristics such as the relative dielectric constant and the dielectric loss tangent being maintained at a satisfactory level.

Preferably, the metal wiring on the organic insulating film is made of a material containing at least one metal selected from the group consisting of Cu, Au, Ag, Al, Ni, Ti, Cr, NiCr, Nb, and V.

By using the metal wiring made of a material containing at least one metal selected from the group consisting of Cu, Au, Ag, Al, Ni, Ti, Cr, NiCr, Nb, and V, a thin-film circuit substrate with a high reliability, provided with the metal wiring having a low resistance and a high bonding strength for the organic insulating film, can be obtained.

Preferably, the organic insulating film contains at least one resin selected from the group consisting of polyimide resins, epoxy resins, benzocyclobutene resins, bismaleimide triazine resins, acrylic resins, and cyclic olefin resins.

By using the material to constitute the organic insulating film which contains at least one resin selected from the group consisting of polyimide resins, epoxy resins, benzocyclobutene resins, bismaleimide triazine resins, acrylic resins and cyclic olefin resins, a thin-film circuit substrate with a high reliability, provided with the organic insulating film having a high bonding strength for metal wiring, can be obtained.

A method of producing the above-described thin-film circuit substrate in accordance with the present invention includes a step of irradiating the surface of the organic insulating film with at least one kind of ions selected from the group consisting of He ions, Ne ions, Ar ions, Kr ions, and Xe ions, such that the surface modification layer having a surface modification coefficient of 0.1 to 0.5 is formed.

By irradiating the surface of the inorganic insulating film with at least one kind of ions selected from the group consisting of He ions, Ne ions, Ar ions, Kr ions, and Xe ions, the surface modification layer having a surface modification coefficient of 0.1 to 0.5 can be securely formed at the surface of the organic insulating film without deterioration of the characteristics which may be caused by excess oxidation at the surface of the organic insulating film.

Moreover, a method of producing the above-described thin-film circuit substrate in accordance with the present invention includes a step of irradiating the surface of the organic insulating film with plasma containing at least one of $N_2$ and Ar such that the surface modification layer having a surface modification coefficient of 0.1 to 0.5 is formed.

By irradiating the surface of the inorganic insulating film with plasma containing at least one of $N_2$ and Ar, the surface modification layer having a surface modification coefficient of 0.1 to 0.5 can be securely formed at the surface of the organic insulating film without deterioration of the characteristics which may be caused by excess oxidation at the surface of the organic insulating film.

A method of producing the above-described thin-film circuit substrate in accordance with the present invention includes a step of irradiating the surface of the organic insulating film with UV rays such that the surface modification layer having a surface modification coefficient of 0.1 to 0.5 is formed at the surface of the organic insulating surface.

By irradiating the surface of the inorganic insulating film with UV rays, the surface modification layer having a surface modification coefficient of 0.1 to 0.5 can be securely formed at the surface of the organic insulating film without deterioration of the characteristics which may be caused by excess oxidation at the surface of the organic insulating film.

The high frequency module in accordance with the present invention uses the above-described thin-film circuit substrate.

By forming the high frequency module for use in millimeter wave or microwave regions by using the above-described thin-film circuit substrate, a high frequency module with a high reliability, having a high bonding strength of the metal wiring to the organic insulating film, can be provided.

DESCRIPTION OF THE PREFERRED EMBODIMENTS

Hereinafter, preferred embodiments of the present invention will be described to make the characteristics of the present invention more apparent.

FIGS. 1A to 1F show a process of producing a thin-film circuit substrate in which an organic insulating film is formed on a substrate, and a metal wiring made of a thin-film metal is formed on the organic insulating film.

In this embodiment, a lift-off technique is employed to form the metal wiring on the organic insulating film. The method of forming a metal wiring according to the present invention is not limited to the above-described method. Other appropriate methods are available.

Figure 1A:
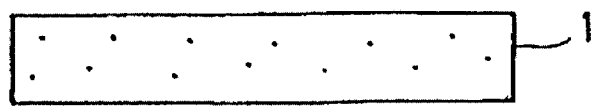
FIGS. 1A to 1F show a process of forming an organic insulating film on a substrate, and forming a metal wiring made of a thin-film metal on the organic insulating film to produce a thin-film circuit substrate.

(1) First, an Si substrate is prepared as a substrate 1 (FIG. 1A). Ceramic substrates made of alumina or the like, and metal substrates made of Si, GaAs, or the like may be employed as the substrate 1. Other types of substrates may be used.

Then, the surface of the substrate 1 is cleaned by plasma ashing, by using an organic solvent such as acetone, isopropyl alcohol, methanol, ethanol, or the like, or by another appropriate method.

Figure 1B:
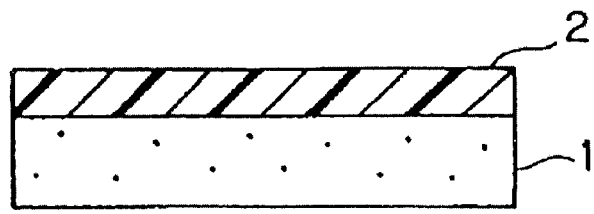

(2) Next, an adhesion-improving agent such as 3APS (3-aminopropyl silane) or the like is applied to the substrate 1. After that a varnish containing a benzocyclobutene resin (solid content 46%) is spin-coated at 1000 rpm for 30 seconds and is baked by means of a hot plate at 95° C. for 120 seconds. Moreover, the resin is cured at 200° C. for 1 hour in a nitrogen atmosphere with an oxygen concentration of up to 100 ppm, so that the benzocyclobutene resin is thermally polymerized. Thus, an organic insulating film 2 (the film-thickness is 15 μm) is formed (FIG. 1B).

In this embodiment, the benzocyclobutene resin is used as a resin material to constitute the organic insulating film 2. Polyimide, epoxy resins, bismaleimide triazine resins, acrylic resins, cyclic olefin resins, and the like may be employed, in addition to the benzocyclobutene resin.

Figure 1C:
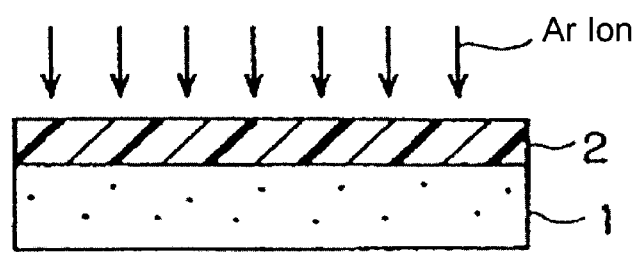

(3) Next, the organic insulating film (benzocyclobutene resin) 2 is surface-treated as shown in FIG. 1C. In this embodiment, the surface-treatment is carried out by means of an Ar ion irradiation apparatus at an RF power of 400 W, an Ar gas flow rate of 20 sccm, a back pressure of $5.2 \times 10^{-4}$ Torr, and an ion current density of 0.35 mA/cm$^2$.

Figure 1D:
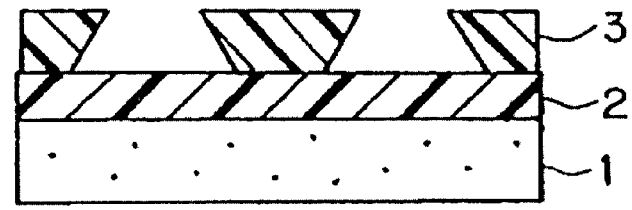

(4) Next, a resist pattern 3 for lift-off is formed by a chlorobenzene method, as shown in FIG. 1D.

To form the resist pattern 3 for lift-off, a positive-resist for formation of thick films (AZP4620, manufactured by Clariant Co.) is spin-coated onto a benzocyclobutene resin at 1500 rpm for 30 sec. to form a resist film with a film-thickness of 6 μm, and is pre-baked in a clean oven at 90° C. for 30 min.

Subsequently, the substrate is dipped for 10 min. in chlorobenzene of which the temperature is maintained at about 40° C., so that a layer to make it difficult to solve a developer is formed on the resist, and is allowed to stand on a hot plate at 90° C. for 90 sec. to evaporate off excess chlorobenzene.

Subsequently, exposure is carried out by using h rays with an adhesion-exposure apparatus. The substrate 1 is dipped in an alkali developer AZ400K (manufactured by Clariant Co.) for 2 min. Thereafter, the substrate 1 is cleaned with refined pure water for at least 5 min., and is dried by means of a spin drier. Thereby, the resist pattern 3 for lift-off is formed on the organic insulating film 2.

Figure 1E:
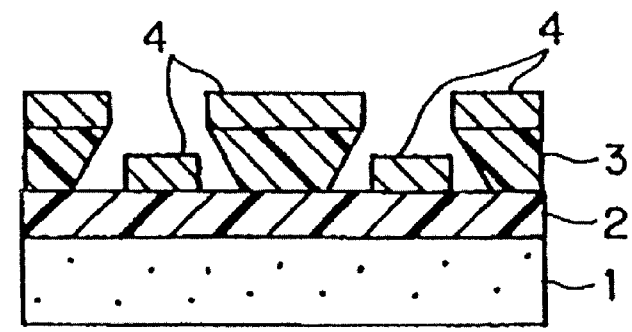

(5) Subsequently, as shown in FIG. 1E, the substrate 1 is placed in a vacuum-evaporation apparatus, in which Ti is formed into a film with a film-thickness of 100 nm as an adhesion layer for the organic insulating film (benzocyclobutene resin) 2. Thereafter, Cu as an electrode material is formed into a film with a film-thickness of 5 μm to form an electrode film 4 on the Ti film (not shown).

Figure 1F:
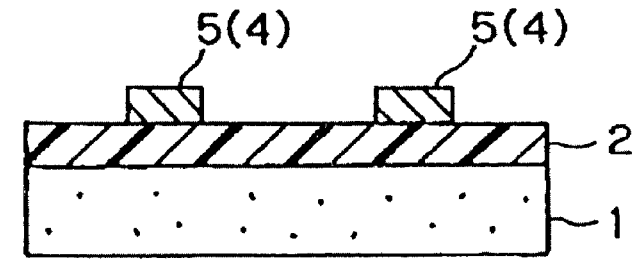

(6) Thereafter, as shown in FIG. 1F, the substrate 1 is dipped into acetone, and supersonically cleaned, so that the lift-off resist pattern 3 and the undesired portion of the electrode film 4 present on the resist pattern 3 are lifted off. Thus, a target metal wiring (electrode pattern) 5 (4) is obtained.

Accordingly, a thin-film circuit substrate in accordance with the present invention including the substrate 1, the organic insulating film 2 formed on the surface of the substrate 1, and the metal wiring 5 formed on the organic insulating film 2 in a predetermined pattern is produced.

Evaluation of the Adhesion of the Organic Insulating Film to the Metal Wiring Formed on the Surface of the Film Hereinafter, a method of evaluating adhesion between the organic insulating film and the metal wiring formed on the surface thereof will be described.

(1) Test for Evaluation of Adhesion

Figure 2:
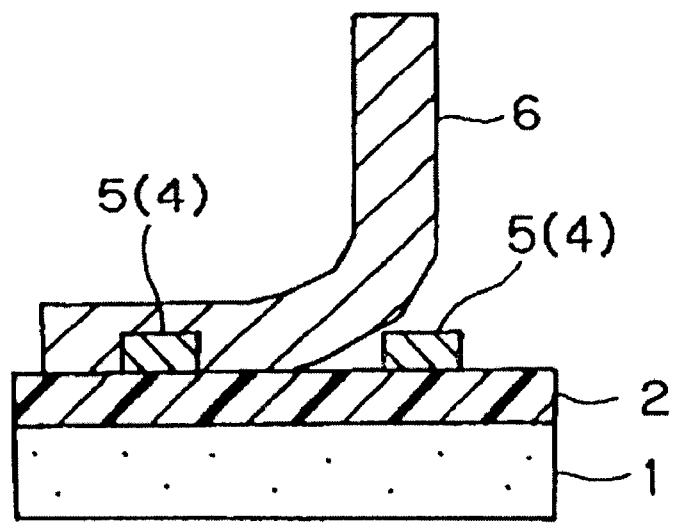
FIG. 2 illustrates a tape peeling test for evaluating the bonding strength of the metal wiring (electrode)

To evaluate adhesion between the organic insulating film and the metal wiring, a tape peeling test was carried out as shown in FIG. 2. According to the test, a tape 6 for evaluation of the bonding strength (strength of 558 g/cm) is bonded to the substrate 1 having the metal wiring 5 formed thereon, and then, the tape 6 is peeled while the angle of the tape 6 to the substrate 5 is maintained at a right angle.

According to the tape peeling test, the metal wiring 5, stuck to the tape 6, is peeled off the organic insulating film when the bonding strength between the organic insulating film 2 and the metal wiring 5 is insufficient.

In this embodiment, a sample of the comparative example in which the organic insulating film is not surface-treated, and a sample of the embodiment of the present invention in which the organic insulating film is surface-treated by irradiation of Ar ions are prepared. These samples were tested by the tape peeling method, and adhesion between them was evaluated.

With regard to each sample of the comparative example and the embodiment of the invention, which was subjected to the tape peeling test, the width of the metal wiring 5 (electrode line width) was 5 µm. The number (n) of sample pieces was 400.

(2) Evaluation Result of Adhesion

As a result of the tape peeling test, the peeling ratio was 57.9% for the sample of the comparative example in which the organic insulating film was not surface-treated. No film-peeling was found, that is, the film peeling ratio was 0.0% for the sample of the embodiment of the present invention in which the organic insulating film was surface-treated. Accordingly, it has been identified that the surface treatment of the organic insulating film significantly improves the adhesion between the organic insulating film and the metal wiring.

The process from the above described production of the thin-film circuit substrate to the tape peeling test was separately carried out ten times. No film-peeling was found by any of the ten tape peeling tests. That is, it has been confirmed that the high adhesion between the organic insulating film and the metal wiring (electrode) can be securely reproduced.

(3) Evaluation of Characteristics of Organic Insulating Film

Figure 3:
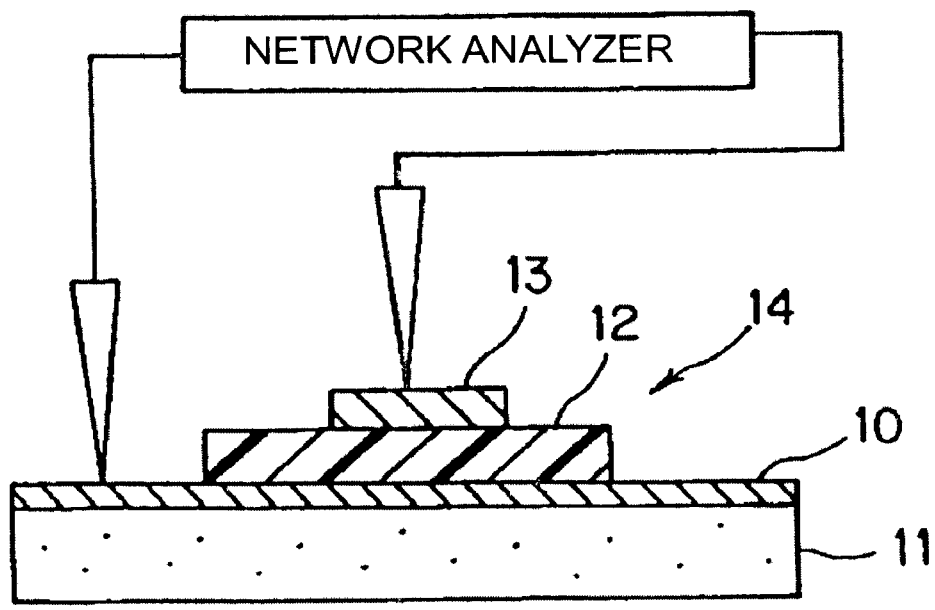
FIG. 3 illustrates a method of evaluating the electrical characteristics of an example of the present invention and a comparative example thereof.

An organic insulating film (benzocyclobutene resin) 12 was formed on a substrate 11 having an electrode 10 as shown in FIG. 3. Moreover, an electrode 13 was formed on the organic insulating film 12. Thus, a MIM (Metal Insulator Metal) capacitor 14 containing the organic insulating film 12 as a dielectric film was formed. The electrical characteristics of the organic insulating film 12 (relative dielectric constant ∈r, dielectric loss tangent δ, and leak current) were measured by means of a network analyzer. Table 1 shows the evaluation results of the characteristics of surface-treated organic insulating films and not surface-treated organic insulating films.

TABLE 1

|  | ∈r | tangent δ (%) | leak current (nA/cm²) |
| --- | --- | --- | --- |
| no surface-treatment | 2.6 | 0.34 | 0.12 |
| surface-treated (irradiation with Ar ions for 5 min.) | 2.6 | 0.36 | 0.16 |

It has been confirmed that there is no significant difference in the characteristics between the organic insulating films surface-treated and not surface-treated, as shown in TABLE 1.

Measurement of the Surface Modification Coefficient of the Organic Insulating Film Measurements were made on the surface modification coefficients of the organic insulating films not surface-treated and surface-treated of the samples of the comparative examples and the embodiments of the invention.

To measure the surface modification coefficients, the surfaces of the organic insulating films of the samples of the comparative example and the embodiments of the invention were observed by the X-ray photoelectron spectroscopy. The state of C atoms at the surfaces of the organic insulating films was analyzed.

Figure 4:
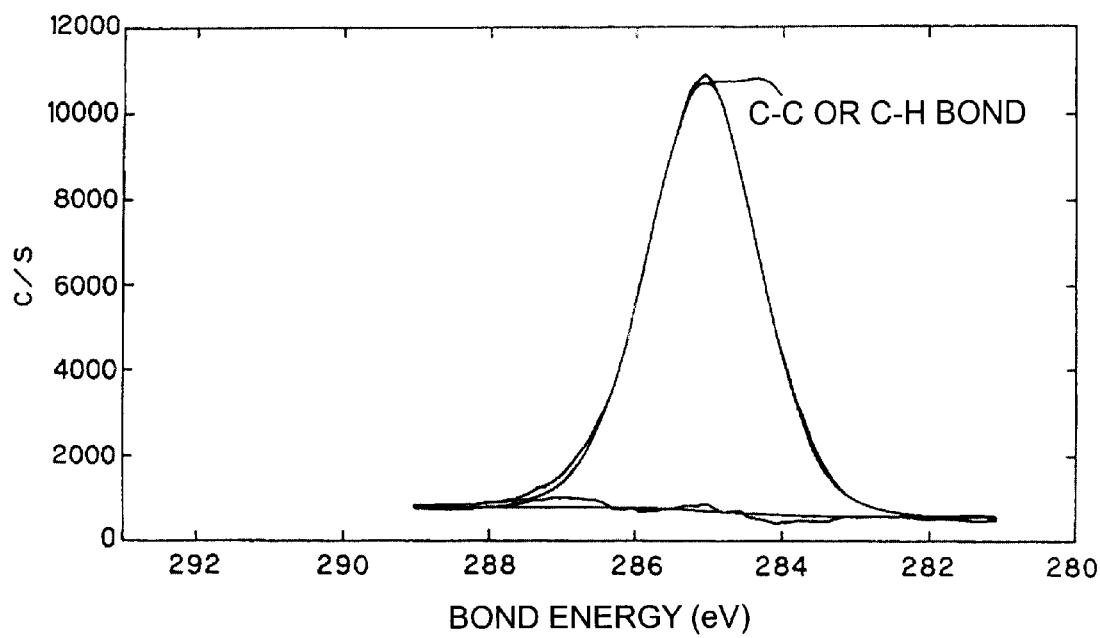
FIG. 4 shows the C1s spectra by X-ray photoelectron spectroscopy of the organic insulating film not surface-treated of the comparative example.
Figure 5:
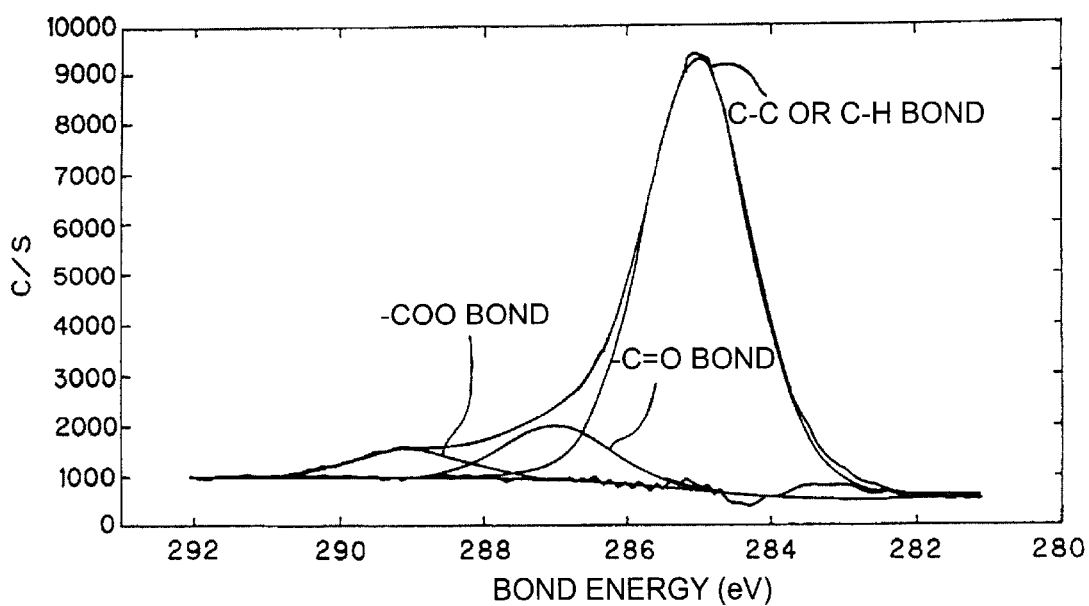
FIG. 5 shows the C1s spectra by X-ray photoelectron spectroscopy of the surface-treated organic insulating film of the example of the present invention.

FIG. 4 shows the C1s spectra at the surface of the organic insulating film not surface-treated of the comparative example. FIG. 5 shows the C1 spectra at the surface of the organic insulating film surface-treated of the embodiment of the present invention.

In the case of the sample not surface-treated of the comparative example, only the spectra of the C—H bonds and C—C bonds contained in the organic insulating film (benzocyclobutene resin) were detected as shown in FIG. 4 (the bond energy of about 285 eV at the spectral peak). In the case of the surface-treated sample of an embodiment of the present invention as shown in FIG. 5, not only the spectra of the C—H and C—C bonds but also the spectra representing functional groups, that is, —C═O bonds (the bond energy of about 287 eV at the spectral peak) and —COO bonds (the bond energy of about 289 eV were detected).

These functional groups are formed as follows. The C—H bonds and the C—C bonds in the benzocyclobutene resin are broken by Ar ions, followed by linkage with oxygen in the atmosphere.

Evaluation of the Surface Modification Coefficient of the Organic Insulating Film Subsequently, the surface modification coefficient of the organic insulating film of the surface-treated sample with Ar ions was determined.

In the present invention, the surface modification coefficient of the organic insulating film is defined as the ratio of C atoms constituting the functional groups to the C atoms present at the surface of the organic insulating film. The surface modification coefficient (SMC) is expressed by the following formula:

$$SMC = \frac{\text{the total number of functional groups}}{\text{the total number of C atoms present at the surface of the organic insulating film}} \quad (1)$$

In the case of the surface-treated sample of the example of the present invention (see FIG. 5), the ratios of the C atoms contained in the respective bonds at the surface of the organic insulating film are as follows. The percentage of the C atoms contained in the C—H or C—C bonds is 84%, that of the C atoms in the —C═O bonds is 10%, and that of the C atoms in the —COO bonds is 6%. Thus, the percentage of the C atoms constituting the functional groups to the C atoms present at the surface of the inorganic insulating film is the sum of 10% for the —C═O bonds and 6% of the —COO bonds, that is, 16%. Accordingly, the surface modification coefficient, calculated by the above-formula (1), is 0.16 (16/100=0.16).

On the other hand, in the case of the not surface-treated sample of the comparative example (see FIG. 4), only the spectra of the C—H bonds or C—C bonds were detected, and no spectra of the function groups were detected. Accordingly, the surface modification coefficient is zero.

Surface Treatment Time and the Surface Modification Coefficient of the Organic Insulating Film Moreover, relationships between the time for surface-treatment of the organic insulating film by irradiation with Ar ions, the surface modification coefficient, and adhesion of the organic insulating film to the metal wiring (electrode) were examined. In particular, the surface modification coefficient and the film-peeling ratio were measured at Ar irradiation time periods of 15 sec. and 120 min.

The state of carbon atoms at the surface of the organic insulating film at an Ar ion irradiation time of 15 sec. was measured by the X ray photoelectron spectroscopy. The surface modification coefficient was 0.06.

The film-peeling ratio of the metal wiring (electrode line width of 5 μm (n=400)) by the tape peeling test was 30.1%. Thus, the adhesion between the organic insulating film and the metal wiring (electrode) was insufficient.

The state of carbon atoms at the surface of the organic insulating film at an Ar ion irradiation time of 120 min. was measured by the X ray photoelectron spectroscopy. The surface modification coefficient was 0.59.

The film-peeling ratio of the metal wiring (electrode line width of 5 μm (n=400)) by the tape peeling test was 0.0%. Thus, it has been confirmed that the adhesion between the organic insulating film and the metal wiring (electrode) is sufficient.

The MIM capacitor shown in FIG. 3 was formed by using the above-described sample. The electrical characteristics (relative dielectric constant ∈r, dielectric loss tangent tan δ, leak current) were measured by means of the network analyzer. As shown in Table 2, the electrical characteristics were deteriorated. Thus, desired characteristics for a high frequency device could not be obtained.

TABLE 2

|  | ∈r | tangent δ (%) | leak current (nA/cm$^2$) |
|---|---|---|---|
| no surface-treatment | 2.6 | 0.34 | 0.12 |
| surface-treated (irradiation with Ar ions for 120 min.) | 2.8 | 1.84 | 125.67 |

Moreover, the following has been confirmed, when the surface modification coefficient of the organic insulating film is made to be within the range of 0.1 to 0.5 by controlling the surface treatment conditions (treatment time and so forth), adhesion between the organic insulating film and the metal wiring (electrode) can be sufficiently enhanced with the electrical characteristics being maintained substantially with no deterioration, in contrast to the case in which the surface treatment is not carried out.

When the surface modification coefficient is controlled to be in the range of 0.15 to 0.4, the satisfactory results of both of the electrical characteristics and the adhesion can be obtained.

Figure 6:
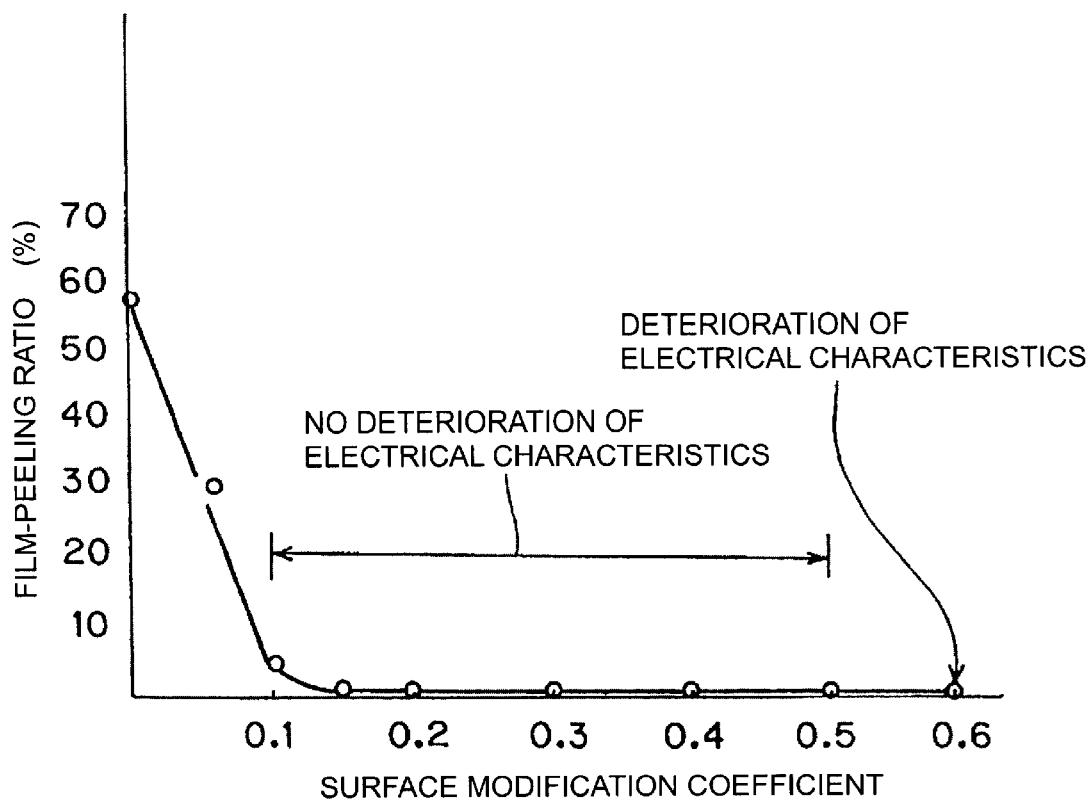
FIG. 6 is a graph showing a relation between a surface modification coefficient and an occurrence ratio of film-peeling (film-peeling ratio).

FIG. 6 shows a relationship between the surface modification coefficient and the occurrence ratio of film-peeling (film-peeling ratio).

Accordingly, by forming the surface modification layer having a surface modification coefficient at the surface of the organic insulating film of 0.1 to 0.5, preferably, 0.15 to 0.4, stable adhesion between the organic insulating film and the metal wiring (electrode) can be obtained without undesirable effects on the electrical characteristics.

In the above-described embodiment, the surface treatment method employing irradiation with Ar ions is described. In addition to this method, irradiation with He, Ne, Kr, or Xe ions, plasma irradiation, and irradiation of UV rays may be employed.

In the above-described embodiment, the case of Cu used as the metal wiring material is described (the adhesion layer is the Ti film). Different types of material each containing at least one element of Au, Ag, Al, Ni, Ti, Cr, NiCr, Nb, and V can be employed as the metal wiring material.

Also, in this embodiment, the benzocyclobutene resin is described as the organic insulating film. Other types of resins such as polyimide, epoxy resins, bismaleimide triazine resins, acrylic resins, cyclic olefin resins, and so forth may be employed.

In other respects, the present invention is not limited to the above-described embodiments. Various applications and modifications may be added without departing from the scope of the present invention.

In the thin-film circuit substrate in accordance with the present invention, the surface modification layer having a surface modification coefficient of 0.1 to 0.5 is provided on the surface of the organic insulating film formed on the substrate, and the metal wiring is formed on the surface of the organic insulating film having the surface modification layer. Accordingly, the bonding strength between the metal wiring (electrode material) and the organic insulating film can be enhanced without the electrical characteristics such as the relative dielectric constant and the dielectric loss tangent being deteriorated.

Preferably, the thin-film circuit substrate is provided with the organic insulating film in which at least one functional group selected from the group consisting of a sulfonic group, a carboxyl group, a carbonyl group, and a phenol group is present at the surface of the surface-modification layer. In this case, the bonding strength between the metal wiring (electrode material) and the organic insulating film can be enhanced without deteriorating the electrical characteristics such as the relative dielectric constant and the dielectric loss tangent.

Preferably, the thin-film circuit substrate contains the metal wiring made of a material containing at least one metal selected from the group consisting of Cu, Au, Ag, Al, Ni, Ti, Cr, NiCr, Nb, and V. In this case, the thin-film circuit substrate with a high reliability, provided with the metal wiring having a low resistance and a high bonding strength to the organic insulating film, can be obtained.

Moreover, preferably, the material to constitute the organic insulating film contains at least one resin selected from the group consisting of polyimide, epoxy resins, benzocyclobutene resins, bismaleimide triazine resins, acrylic resins, and cyclic olefin resins. In this case, the thin-film circuit substrate with a high reliability, provided with the organic insulating film having a high bonding strength to the metal wiring, can be securely obtained.

According to the method of producing the thin-film circuit substrate, the surface of the inorganic insulating film is irradiated with at least one kind of ions selected from the group consisting of He ions, Ne ions, Ar ions, Kr ions, and Xe ions. Thus, the surface modification layer having a surface modification coefficient of 0.1 to 0.5 can be securely formed on the surface of the organic insulating film without deterioration of the characteristics which may be caused by excess oxidation at the surface of the organic insulating film.

Also, according to the method of producing the thin-film circuit substrate of the present invention, the surface of the inorganic insulating film is irradiated with plasma containing one or both of $N_2$ and Ar so that the surface modification layer is formed. The surface modification layer having a surface modification coefficient of 0.1 to 0.5 can be securely formed on the surface of the organic insulating film without deterioration of the characteristics which may be caused by excess oxidation at the surface of the organic insulating film.

Furthermore, according to the method of producing the thin-film of the present invention, the surface of the inorganic insulating film is irradiated with UV rays so that the surface modification layer is formed. Thus, the surface modification layer having a surface modification coefficient of 0.1 to 0.5 can be securely formed on the surface of the organic insulating film without deterioration of the characteristics which may be caused by excess oxidation at the surface of the organic insulating film.

The high frequency module for use in millimeter wave or microwave regions of the present invention uses the above-described thin-film circuit substrate. Thus, the high frequency module with a high reliability, having a high bonding strength of the metal wiring to the organic insulating film, can be provided.

What is claimed is:

1. A thin-film circuit substrate comprising:
    a substrate;
    an organic insulating film formed on the surface of the substrate; and
    a metal wiring made of a thin-film metal formed on the organic insulating film;
    wherein the surface of the organic insulating film is provided with a surface modification layer having a surface modification coefficient (SMC);
    wherein the $$SMC = \frac{\text{the total number of functional groups}}{\text{the total number of C atoms present at the surface of the organic insulating film}};$$

and
    wherein the surface modification coefficient is about 0.1 to 0.5.

2. A thin-film circuit substrate according to claim 1, wherein at least one functional.group selected from the group consisting of a sulfonic group, a carboxyl group, a carbonyl group, and a phenol group is present at the surface of the surface-modification layer.

3. A thin-film circuit substrate according to claim 1 or 2, wherein the metal wiring on the organic insulating film is made of a material containing at least one metal selected from the group consisting of Cu, Au, Ag, Al, Ni, Ti, Cr, NiCr, Nb, and V.

4. A thin-film circuit substrate according to claims 1 or 2, wherein the organic insulating film contains at least one resin selected from the group consisting of polyimide resins, epoxy resins, benzocyclobutene resins, bismaleimide triazine resins, acrylic resins, and cyclic olefin resins.

5. A method of producing the thin-film circuit substrate as set forth in claims 1 or 2, comprising a step of irradiating the surface of the organic insulating film with at least one kind of ions selected from the group consisting of He ions, Ne ions, Ar ions, Kr ions, and Xe ions such that the surface modification layer having a surface modification coefficient of 0.1 to 0.5 is formed.

6. A method of producing the thin-film circuit substrate as set forth in claims 1 or 2, comprising a step of irradiating the surface of the organic insulating film with plasma containing at least one of $N_2$ and Ar such that the surface modification layer having a surface modification coefficient of 0.1 to 0.5 is formed.

7. A method of producing the thin-film circuit substrate as set forth in claims 1 or 2, comprising a step of irradiating the surface of the organic insulating film with UV rays such that the surface modification layer having a surface modification coefficient of 0.1 to 0.5 is formed.

8. A high frequency module using the thin-film circuit substrate as set forth in claims 1 or 2.

* * * * *